(12) United States Patent
Löbl et al.

(10) Patent No.: US 6,420,096 B1
(45) Date of Patent: Jul. 16, 2002

(54) METHOD OF MANUFACTURING ELECTRONIC STRIPLINE COMPONENTS

(75) Inventors: Hans-Peter Löbl, Monschau (DE);
Paul Van Oppen, Roermond (NL);
Mareike Klee, Hückelhoven-Brachelen;
Martin Fleuster, Aachen, both of (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/541,767

(22) Filed: Apr. 3, 2000

(30) Foreign Application Priority Data

Apr. 3, 1999 (DE) .......................................... 199 15 245

(51) Int. Cl.⁷ ................................................ G03F 7/26
(52) U.S. Cl. ...................................... 430/313; 311/318
(58) Field of Search ................................ 430/311, 318, 430/313

(56) References Cited

U.S. PATENT DOCUMENTS

| | | | | |
|---|---|---|---|---|
| 3,796,976 A | | 3/1974 | Heng et al. ..................... 333/84 |
| 5,747,095 A | * | 5/1998 | McAllister et al. ............ 427/8 |
| 5,763,143 A | * | 6/1998 | Sakura ....................... 430/330 |
| 5,773,197 A | * | 6/1998 | Carter et al. ................. 430/313 |
| 5,885,750 A | * | 3/1999 | Hsiao et al. ................. 430/314 |
| 5,972,569 A | * | 10/1999 | Jeng et al. .................. 430/312 |
| 6,042,996 A | * | 3/2000 | Lin et al. .................... 430/313 |
| 6,171,763 B1 | * | 1/2001 | Wang et al. ................. 430/318 |
| 6,235,544 B1 | * | 5/2001 | Franklin et al. .......... 324/158.1 |
| 6,251,766 B1 | * | 6/2001 | Desai et al. ................ 438/614 |
| 6,255,039 B1 | * | 7/2001 | Xu et al. .................... 430/318 |

* cited by examiner

Primary Examiner—Janet Baxter
Assistant Examiner—Amanda C. Walke
(74) Attorney, Agent, or Firm—Ernestine C. Bartlett (57) ABSTRACT

The invention describes a method of manufacturing an electronic thin-film component comprising at least one stripline. In this method, first a metallic base layer is deposited on a substrate layer, a photoresist layer is applied to this metallic base layer, and structured in accordance with the stripline(s) to be formed. An electroconductive layer is deposited on the exposed regions of the metallic base layer. Subsequently, the photoresist is removed and the metallic base layer is etched. This method has the advantage that less metal is required as compared to other thin-film methods. Overlapping areas of the striplines can be formed readily, economically, and with small current capacitances by means of bridges. By means of the method described herein, passive components, such as thin-film couplers for high-frequency applications or thin-film coils can be readily obtained.

11 Claims, 7 Drawing Sheets

METHOD OF MANUFACTURING ELECTRONIC STRIPLINE COMPONENTS

BACKGROUND OF THE INVENTION

The invention relates to a method of manufacturing electronic components comprising at least one stripline.

Striplines in a plurality of designs are the most frequently used line types for the circuit technology in the VHF range and the microwave range, as well as in fast digital circuits, in so far as special requirements regarding very low damping levels or a high power transfer do not require the use of coaxial lines or waveguides. The stripline design also enables passive components, such as coils or couplers, to be readily realized.

Couplers are used, inter alia, as high-frequency components for mobile telephones or base stations, enabling decoupling of HF signals between the output of a power amplifier and an antenna. The decoupled signal is used to control the output power of the amplifier. Such a coupler comprises, for example, two coupler loops; one of said loops being the main loop for transmitting the transmit signal with as little loss as possible. The second loop, which is commonly referred to as auxiliary loop, decouples a signal which is small relative to the transmit signal.

Different embodiments of such couplers are known. On the one hand, there are ceramic multilayer couplers. In these ceramic couplers, the electrode structures are printed onto ceramic foils, which foils are stacked and sintered into components. The drawback of this printing process resides in the coarse-grain morphology of the electrodes, which leads to a higher electric resistance. A further drawback is the small accuracy of the printing process. This may lead to scattering of the electronic properties.

On the other hand, there are couplers manufactured in microstrip technology. In 1991 IEEE MTT-S International Microwave Symposium Digest, Vol. II, 856–860, a thin-film coupler is described comprising two striplines serving as coupler loops. Both coupler loops are provided on a dielectric substrate having a high dielectric constant K. On the rear side of the ceramic substrate, there is also a metallic layer which serves as a ground plane. In addition, six end contacts are secured to the component, two of which contact a coupler loop and two contact the ground plane.

SUMMARY OF THE INVENTION

It is an object of the invention to provide a method by means of which electronic components comprising at least one stripline, particularly couplers, can be readily and very accurately manufactured at low cost.

This object is achieved by a method of manufacturing electronic components comprising at least one stripline, wherein a metallic base layer is deposited on a substrate layer, a layer of a photoresist is applied to this metallic base layer and provided with a structure, an electroconductive layer is deposited on the exposed areas of the metallic base layer, the photoresist is removed, and the metallic base layer is etched.

This method has the advantage that less metal is required than in other thin-film processes. In the known thin-film processes, first the electroconductive layer is deposited and, subsequently, this layer is structured by means of photolithographic processes. In the method in accordance with the invention, the thin, metallic base layer is provided with an inexpensive photoresist layer, which is subsequently structured. Next, the electroconductive layer is deposited, in the holes of the photoresist, on the exposed, metallic base layer. This method enables compact components of small dimensions to be manufactured.

Preferably, the material for the substrate layer is a ceramic material, a ceramic material having a planarizing layer of glass, a glass-ceramic material or a glass material.

A substrate layer of these materials can be economically manufactured, and the process costs for these components can be kept low.

It is further preferred that Cr/Cu is used as the material for the metallic base layer.

A metallic base layer is provided to facilitate the subsequent deposition of the electroconductive layer and improve the adhesion of the stripline onto the substrate layer.

It is also preferred that Cu, Ag, Al or Au is used as the material for the electroconductive layer.

These materials all are satisfactorily conducting metals.

It is preferred that the striplines are situated in one plane when a component comprises two or more striplines.

These components can be readily manufactured at low cost because the striplines can be manufactured in the same process step.

In the case of a component comprising two or more striplines, it may be preferred that the striplines overlap each other at least once.

By means of overlapping areas of the striplines, a plurality of variations in the length and the geometry of the striplines can be achieved, which fulfill the requirements to be met by the component.

In this embodiment, it is preferred that overlapping areas of the striplines are realized by means of bridges of a conductive material.

By means of bridges, overlapping areas of the striplines can be formed in a simple manner. In addition, the sections of the striplines extending in one plane may be provided on the substrate layer in the same process step. The completion of the relevant stripline by means of a bridge of a conductive material takes place in a later process step.

It is also preferred that each end of a stripline is in electrical contact with a current supply.

At the current supplies, each component can be electrically connected to further components of a switching circuit. Dependent upon the application or the way in which the component is mounted, an electroplated SMD end contact or a bump end contact or a contact surface can be used for the current supply. The use of SMD end contacts or bump end contacts enables discrete components to be manufactured.

It is also preferred that a protective layer of an inorganic material and/or organic material is provided on the component.

By virtue of said protective layer, the component is protected against mechanical stress and corrosion due to moisture.

It may be advantageous that the lower side of the substrate layer is provided with a ground plane. In this advantageous embodiment, it is preferred that the metallic layer is connected to at least one further current supply.

BRIEF DESCRIPTION OF THE DRAWINGS

The invention will now be described in greater detail with reference to the figures of the drawing.

In the drawings.

DETAILED DESCRIPTION OF THE INVENTION

Figure 1:
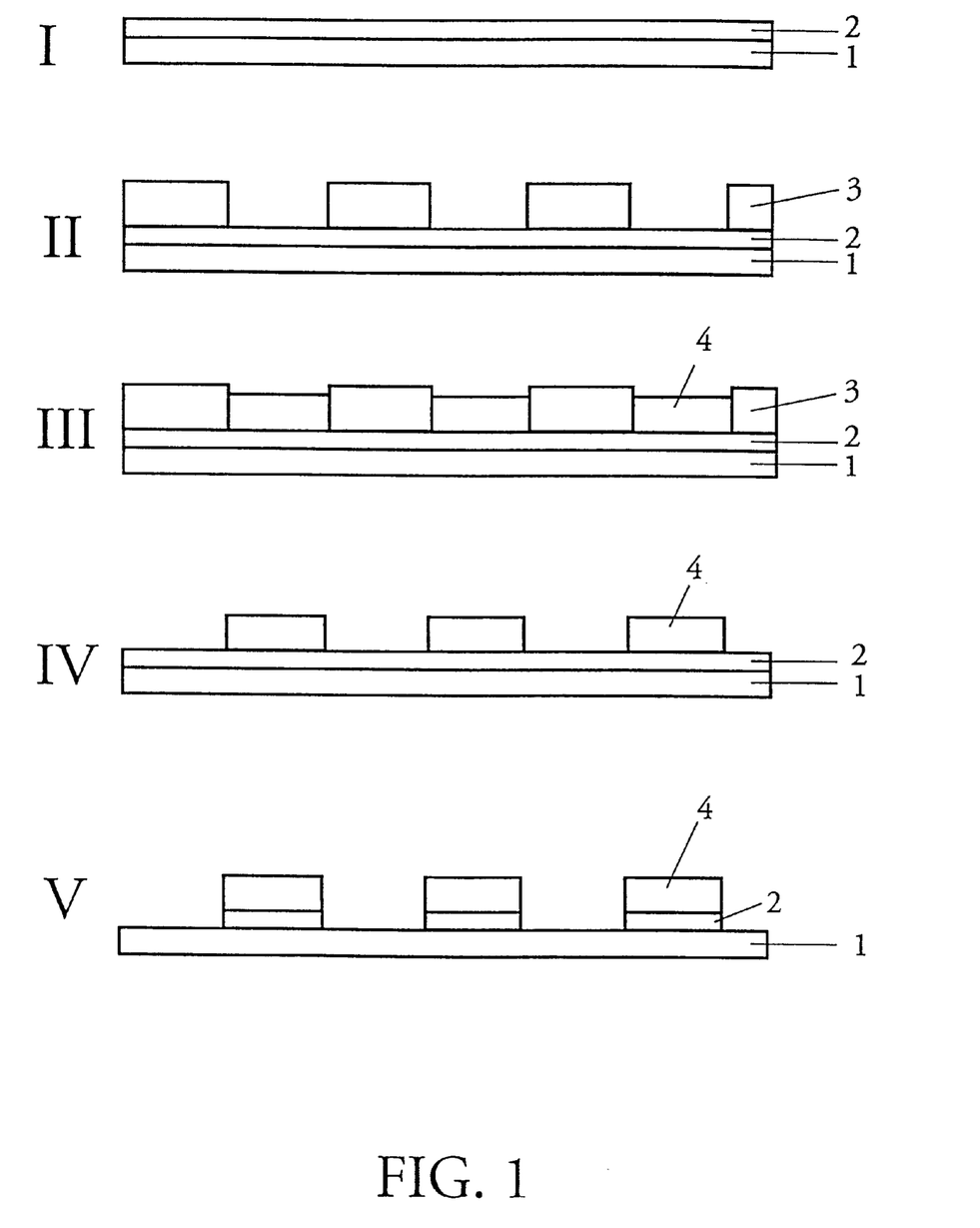
FIG. 1 shows a flow diagram for the manufacture of a component comprising at least one stripline.

In accordance with process step I in FIG. 1, first a metallic base layer 2 is deposited on a substrate layer 1, which comprises, for example, a ceramic material, a ceramic material with a planarizing layer of glass, a glass-ceramic material or a glass material. This metallic base layer 2 may include, for example, Cr/Cu. This metallic base layer 2 is coated with a layer 3 of a photoresist, which is structured in accordance with the stripline to be formed (process step II in FIG. 1). Subsequently, the metallic base layer 2 is reinforced by depositing an electroconductive layer 4 until the stripline has reached the desired thickness (process step III in FIG. 1). For this purpose, use can be made, for example, of an electrodeposition process. As the material for this electroconductive layer 4, use is made of a properly conducting metal, such as Cu, Ag, Al or Au. In the next step, the photoresist 3 is removed (process step IV in FIG. 1), and, subsequently, the metallic base layer 2 is etched (process step V in FIG. 1). For this purpose, use can be made of a wet-chemical etch process or a physical etch process.

Figure 2:
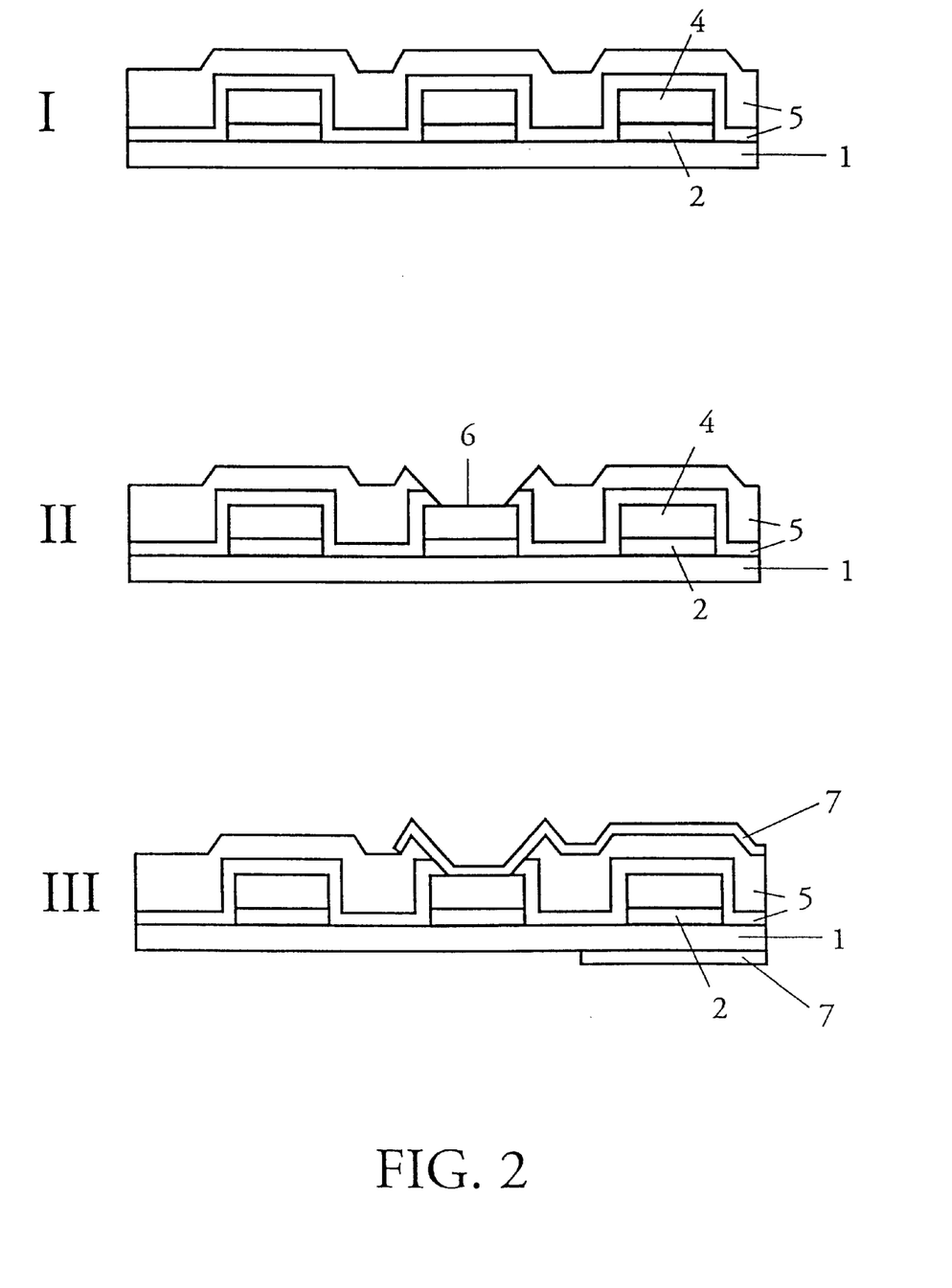
FIG. 2 shows a flow diagram for the deposition of a protective layer and the manufacture of a metallic base layer for current supplies.

In accordance with process step I in FIG. 2, one or more protective layers 5 of an organic and/or inorganic material are applied onto the entire component. For the organic material use can be made, for example, of polybenzocyclobutene or polyimide, and for the inorganic material use can be made, for example, of $Si_3N_4$, $SiO_2$ or $Si_xO_yN_x$ ($0 \leq x \leq 1, 0 \leq y \leq 1, 0 \leq z \leq 1$). Subsequently, a via 6 is etched through the protective layers 5 (process step II in FIG. 2) to enable the striplines to be electrically contacted at a later stage. In the case of photosensitive protective layer materials, said via can be formed by means of photolithographic processes or by means of wet-chemical etching. Subsequently, a further metallic base layer 7 of, for example, Cr/Cu or Cr/Ni is deposited on the parts of the component where the current supplies are to be provided and at locations where the stripline can be electrically contacted (process step III in FIG. 2).

To manufacture SMD end contacts for use as current supplies, the metallic base layer 7 can be reinforced by electrodepositing Ni/Sn, Cu/Ni/Sn or Pb/Sn. Alternatively, a bump end contact or a contact surface can be used as the current supply.

Figure 3:
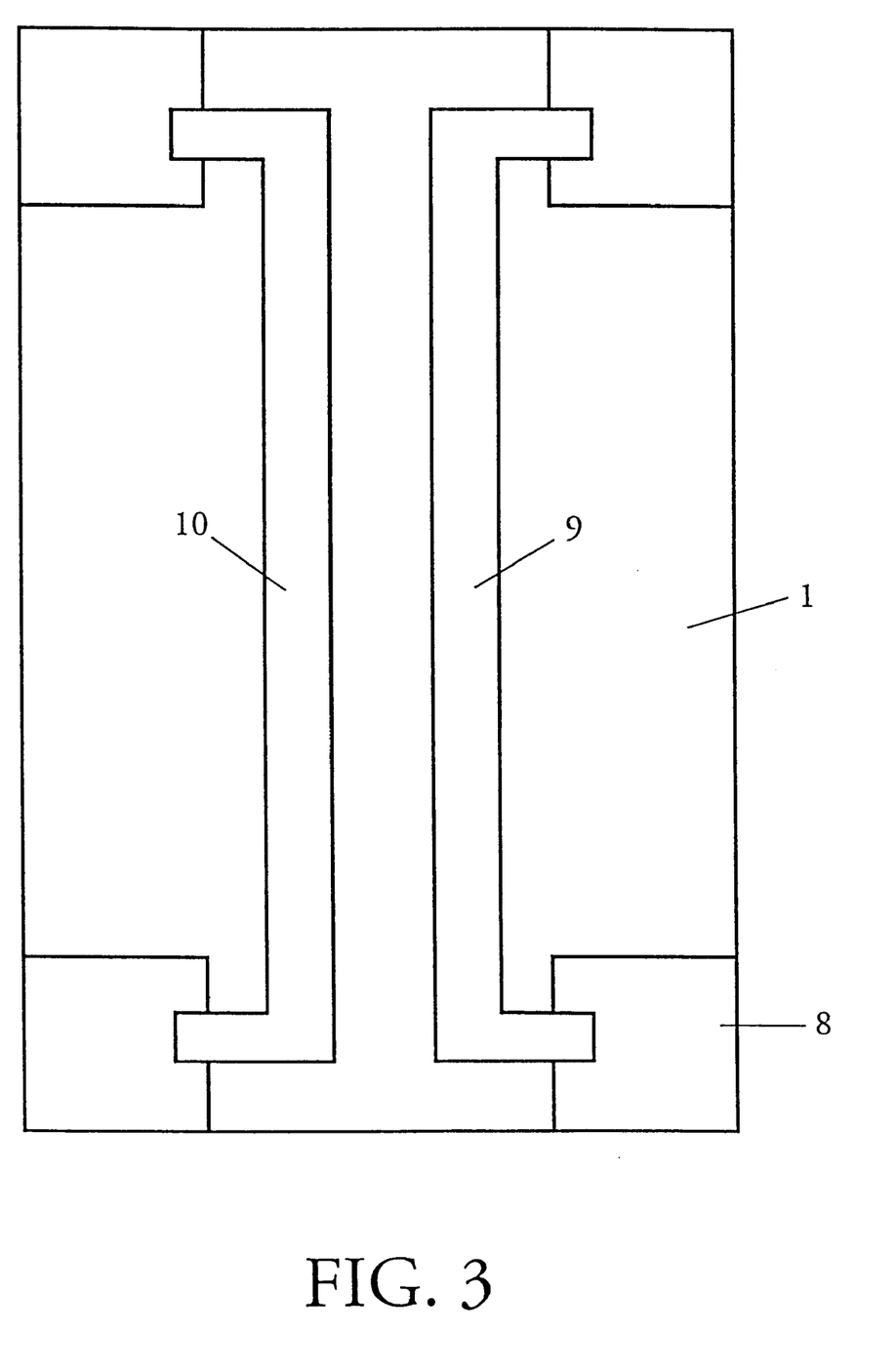
FIG. 3 is a plan view of a coupler, wherein the striplines are situated in one plane.

As shown in FIG. 3, a coupler has two striplines: a main loop 9 and an auxiliary loop 10. Both coupler loops are situated in one plane on a substrate layer 1. In addition, four current supplies 8 are attached to the component, in such a manner that each current supply is connected with another current supply by means of one of the two coupler loops.

Figure 4:
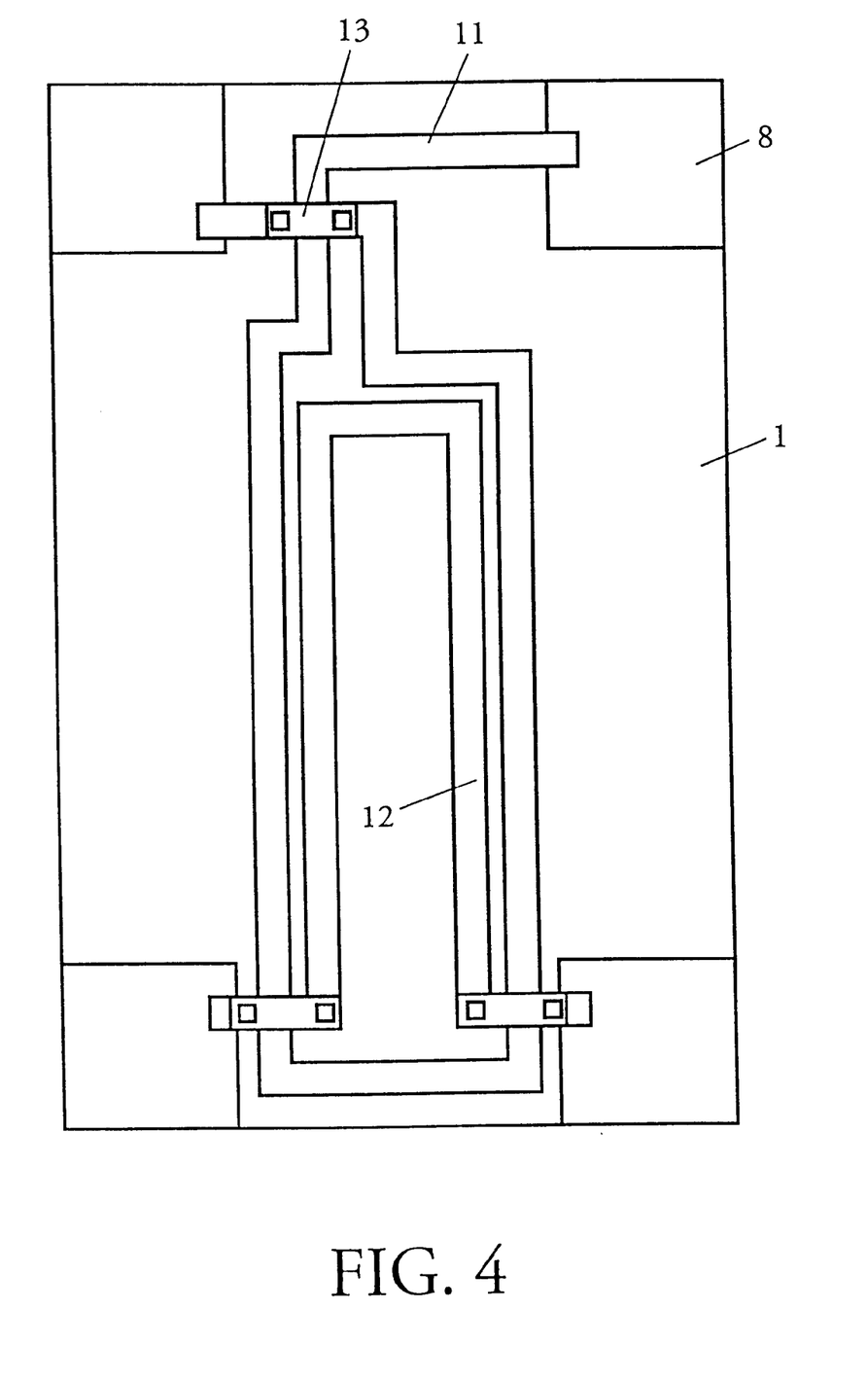
FIG. 4 is a plan view of a coupler, wherein the striplines demonstrate an overlap.

FIG. 4 shows a coupler with two coupler loops 11 and 12 having overlapping portions. Bridges 13 form these overlaps.

Figure 5:
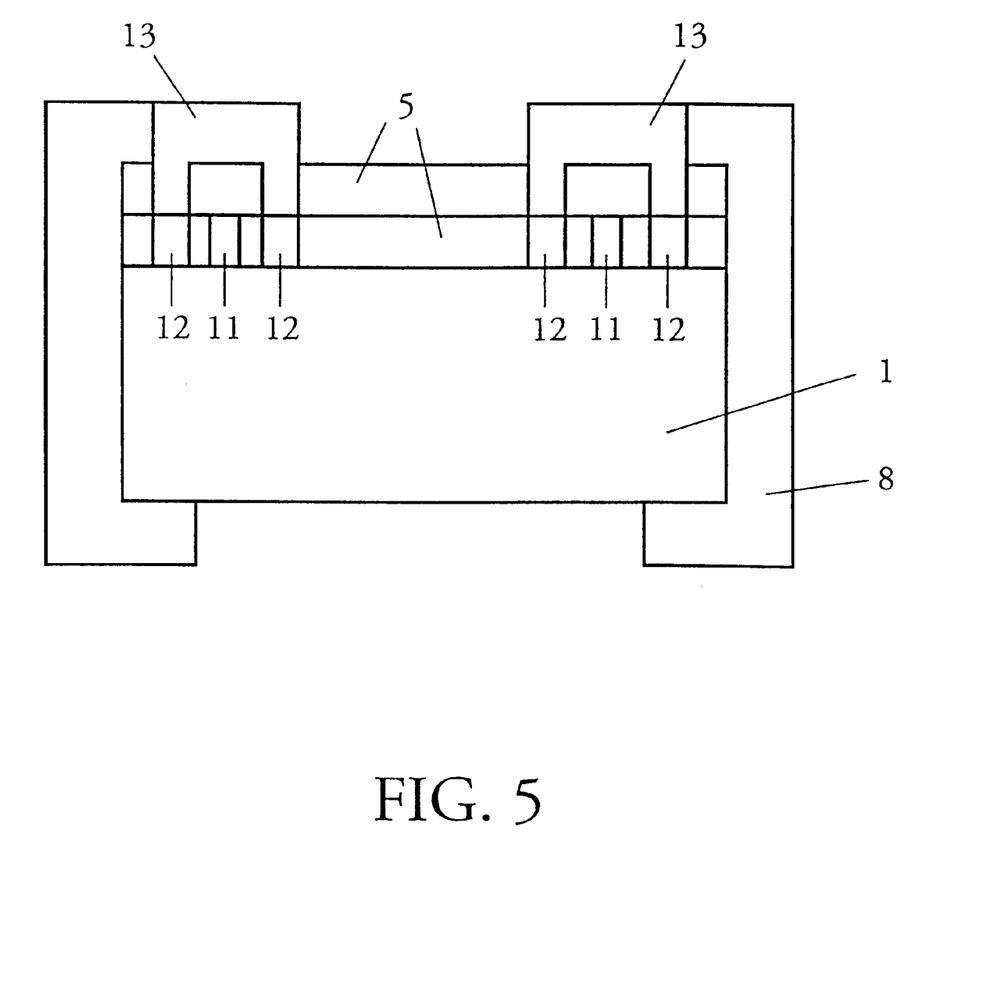
FIG. 5 is a cross-sectional view of stripline overlaps realized by means of bridges.

FIG. 5 shows overlapping portions of the striplines 11 and 12. First, the sections of the striplines 11 and 12 which are situated in one plane are deposited. Next, the sections are electrically interconnected by bridges 13. When the current supplies 8 are manufactured, the bridges are made of the same material as the current supplies.

Figure 6:
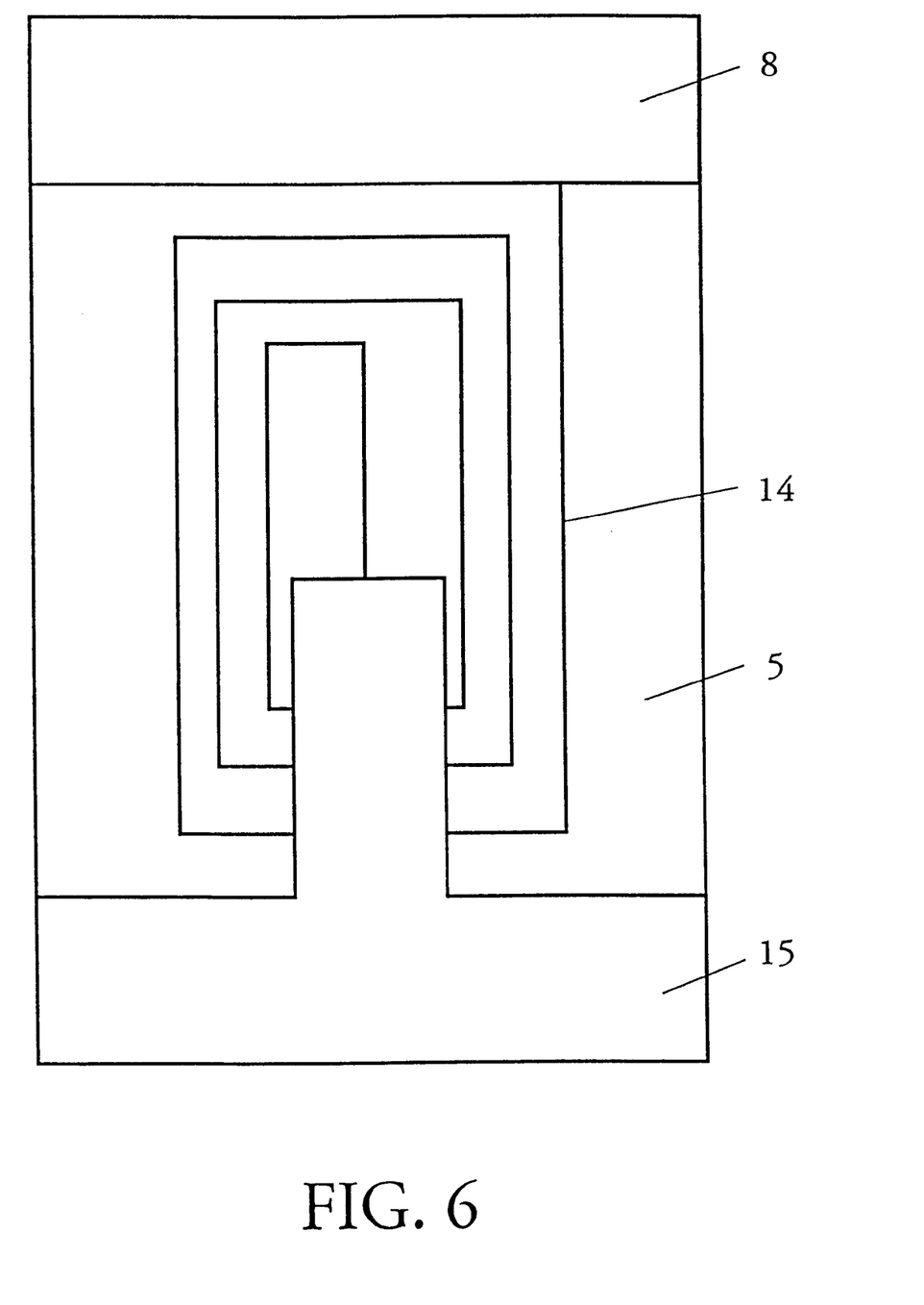
FIG. 6 is a plan view of a coil embodied so as to be a stripline.

FIG. 6 shows a coil comprising windings 14, which are embodied so as to form spiral-shaped, tapering striplines. In addition, current supplies 8 and 15 are provided on opposite sides of the component. The current supply 15 simultaneously provides for electric contact with the center of the coil.

Figure 7:
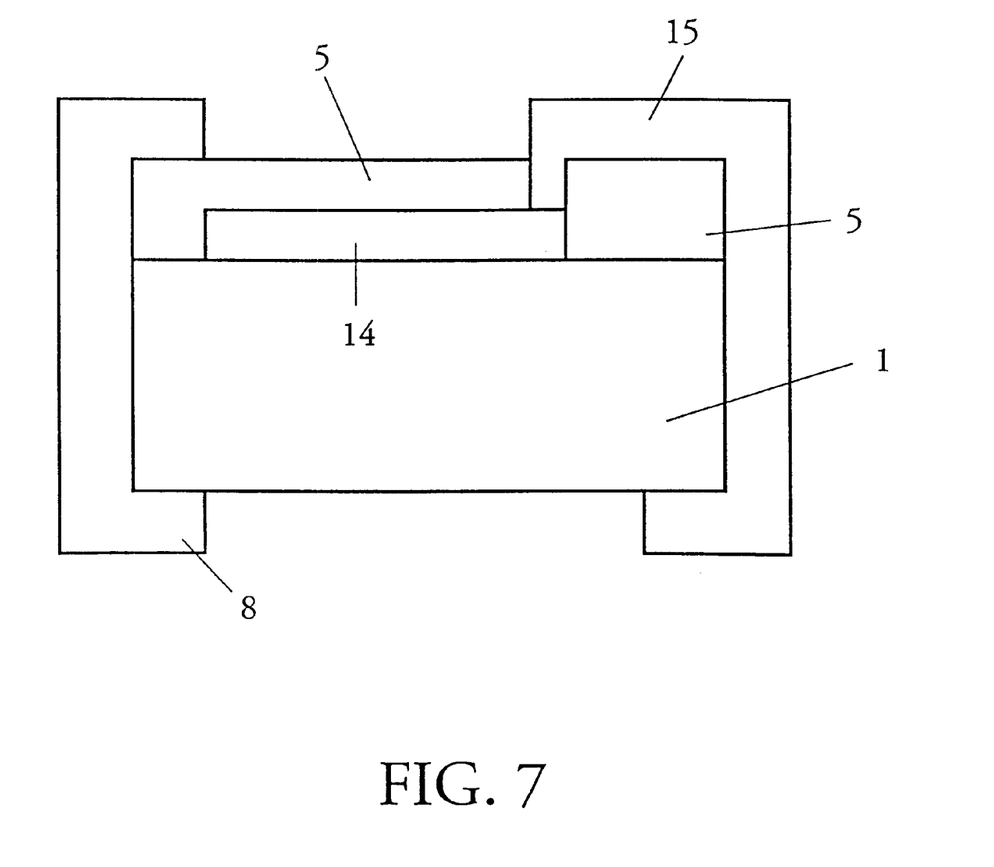
FIG. 7 is a cross-sectional view of a coil embodied so as to be a stripline.

As shown in FIG. 7, such a coil comprises a stripline 14, which is provided on a substrate layer 1. A protective layer 5 is provided on the entire component. Electric contact with the stripline 14 is made via an extension of the current supply 15, which passes through the protective layer 5.

Alternatively, all components on the rear side of the substrate 1 may be provided with a ground plane containing, for example, Cu. In addition, this ground plane may be connected with at least one further current supply.

In the following, embodiments of the invention are explained by means of examples of possible applications.

EXAMPLE 1

To manufacture a thin-film coupler comprising striplines which do not overlap, a metallic base layer 2 of Ni/Cr was deposited on a substrate layer 1 of $Al_2O_3$ with a planarizing layer of glass. Subsequently, this metallic base layer 2 was provided with a photoresist layer 3. This photoresist layer 3 was structured by means of photolithography in such a manner that the photoresist layer 3 exhibited the pattern of the desired coupler loops. In the next step, an electroconductive layer of Cu was electrodeposited on the exposed metallic base layer 2 of Ni/Cr, whereafter the photoresist was removed. The component was entirely provided with a protective layer 5 of polyimide and $Si_3N_4$. In addition, four Cr/Cu, Cu/Ni/Sn SMD end contacts serving as current supplies 8 were secured to the component.

EXAMPLE 2

To produce a thin-film coupler having two striplines of Cr/Cu, Cu which 10 overlap, a substrate 1 of $Al_2O_3$ having a planarizing layer of glass was first provided with the parts of the striplines 11 and 12 which are situated in one plane. Subsequently, the entire component was provided with a plurality of protective layers 5 of polyimide and $Si_3N_4$. At the respective ends of the sections of the striplines 11 and 12, vias were etched through the protective layers 5. Next, a metallic base layer 7 of Cr/Cu was deposited in the vias and on the parts of the component where the current supplies were to be formed. To manufacture Cr/Cu, Cu/Ni/Sn SMD end contacts for use as the current supply 8, and to complete the bridges 13, the metallic base layer 7 was reinforced by electrodeposition of Cu/Ni/Sn.

EXAMPLE 3

A coil embodied so as to be a stripline comprises a substrate layer 1 of glass on which a stripline 14 of Cr/Cu, Cu was provided in the form of a spiral. A protective layer of polyimide was deposited on the entire component. On each side of the component, a Cr/Cu, Cu/Ni/Sn SMD end contact serving as current supplies 8 and 15 was secured. The current supply 15 is in electric contact with the center of the spiral-shaped, tapering stripline 14 via an extension.

What is claimed is:

1. A method of manufacturing electronic components comprising at least one stripline, characterized in that a metallic base layer (2) is deposited on a substrate layer (1), a layer of a photoresist (3) is applied to this metallic base layer (2) and provided with a structure, an electroconductive layer (4) is deposited on the exposed areas of the metallic base layer (2), the photoresist (3) is removed, and the metallic base layer (2) only is etched.

2. A method of manufacturing electronic components comprising at least one stripline, as claimed in claim 1, characterized in that the material for the substrate layer (1) is a ceramic material, a ceramic material having a planarizing layer of glass, a glass-ceramic material or a glass material.

3. A method of manufacturing electronic components comprising at least one stripline, as claimed in claim 1, characterized in that Cr/Cu is used as the material for the metallic base layer (2).

4. A method of manufacturing electronic components comprising at least one stripline, as claimed in claim 1, characterized in that Cu, Ag, Al or Au is used as the material for the electroconductive layer (4).

5. A method of manufacturing electronic components comprising at least one stripline, as claimed in claim 1, characterized in that the striplines (9, 10) are situated in one plane when a component comprises two or more striplines.

6. A method of manufacturing electronic components comprising at least one stripline, as claimed in claim 1, characterized in that the striplines (11, 12) overlap each other at least once in the case of a component comprising two or more striplines.

7. A method of manufacturing electronic components comprising at least one stripline, as claimed in claim 6, characterized in that overlapping areas are realized by means of bridges (13) of a conductive material.

8. A method of manufacturing electronic components comprising at least one stripline, as claimed in claim 1, characterized in that each end of a stripline is in contact with a current supply (8).

9. A method of manufacturing electronic components comprising at least one stripline, as claimed in claim 1, characterized in that at least one protective layer (5) of an inorganic material and/or organic material is provided on the component.

10. A method of manufacturing electronic components comprising at least one stripline, as claimed in claim 1, characterized in that the lower side of the substrate layer is provided with a ground plane.

11. A method of manufacturing electronic components comprising at least one stripline, as claimed in claim 10, characterized in that the ground plane is connected to at least one further current supply.

* * * * *